United States Patent
Kang et al.

(10) Patent No.: US 10,074,823 B2
(45) Date of Patent: Sep. 11, 2018

(54) ORGANIC LIGHT EMTTING DEVICE WITH SHORT CIRCUIT PREVENTING LAYER AND METHOD FOR MANUFACTURING THE SAME

(71) Applicant: LG Display Co., Ltd., Seoul (KR)

(72) Inventors: Minsoo Kang, Daejeon (KR); Young Kyun Moon, Daejeon (KR); Jin Bok Lee, Daejeon (KR); Byung Woo Yoo, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/310,706

(22) PCT Filed: May 4, 2015

(86) PCT No.: PCT/KR2015/004481
§ 371 (c)(1),
(2) Date: Nov. 11, 2016

(87) PCT Pub. No.: WO2015/174673
PCT Pub. Date: Nov. 19, 2015

(65) Prior Publication Data
US 2017/0084863 A1     Mar. 23, 2017

(30) Foreign Application Priority Data

May 12, 2014  (KR) .................. 10-2014-0056780

(51) Int. Cl.
*H01L 51/52*      (2006.01)
*H01L 23/60*      (2006.01)
(Continued)

(52) U.S. Cl.
CPC .......... *H01L 51/5212* (2013.01); *H01L 23/60* (2013.01); *H01L 51/5209* (2013.01);
(Continued)

(58) Field of Classification Search
CPC ................... H01L 51/5212; H01L 51/5228
(Continued)

(56) References Cited

U.S. PATENT DOCUMENTS

2004/0207315 A1* 10/2004 Robbie ............... G09G 3/3216
                                                              313/504
2005/0116629 A1   6/2005 Takamura et al.
(Continued)

FOREIGN PATENT DOCUMENTS

EP          2960961 A1     12/2015
JP       2001-196191 A      7/2001
(Continued)

*Primary Examiner* — Robert Huber
(74) *Attorney, Agent, or Firm* — Dentons US LLP (57) ABSTRACT

The present specification is drawn to an organic light emitting device and a method of manufacturing the same. The organic light emitting device includes a short circuit preventing layer provided on a substrate; a first electrode provided on the short circuit preventing layer, and including two or more conductive units provided to be separated from each other; a second electrode provided opposite to the first electrode; one or more organic material layers provided between the first electrode and the second electrode; and an auxiliary electrode. The short circuit preventing layer electrically connects the auxiliary electrode and the first electrode to control the quantity of leakage current even when a short-circuit defect occurs in the conductive unit.

24 Claims, 4 Drawing Sheets

(51) Int. Cl.
*H01L 51/56* (2006.01)
*H01L 51/00* (2006.01)

(52) U.S. Cl.
CPC ...... *H01L 51/5225* (2013.01); *H01L 51/5228* (2013.01); *H01L 51/0023* (2013.01); *H01L 51/56* (2013.01); *H01L 2251/5338* (2013.01); *H01L 2251/5361* (2013.01)

(58) Field of Classification Search
USPC .......................................... 257/40, E51.019
See application file for complete search history.

(56) References Cited

U.S. PATENT DOCUMENTS

| | | |
|---|---|---|
| 2005/0225234 A1 | 10/2005 | Tyan |
| 2006/0033427 A1 | 2/2006 | Nagayama et al. |
| 2009/0174323 A1 | 7/2009 | Buchel et al. |
| 2009/0206749 A1* | 8/2009 | Matsudate .......... H01L 51/5234 313/505 |
| 2010/0102335 A1 | 4/2010 | Takagi et al. |
| 2012/0286255 A1 | 11/2012 | Tanaka |
| 2013/0140589 A1 | 6/2013 | Kwak |
| 2013/0320388 A1* | 12/2013 | Sekimoto ............ H01L 51/0512 257/99 |
| 2013/0334506 A1 | 12/2013 | Tobise et al. |
| 2014/0239262 A1 | 8/2014 | Kim et al. |
| 2016/0005993 A1 | 1/2016 | Lee et al. |
| 2016/0172618 A1 | 6/2016 | Chen et al. |
| 2016/0260784 A1 | 9/2016 | Amano et al. |

FOREIGN PATENT DOCUMENTS

| | | |
|---|---|---|
| JP | 2002-207732 A | 7/2002 |
| JP | 2004-095388 A | 3/2004 |
| JP | 2007-165215 A | 6/2007 |
| JP | 2008-078038 A | 4/2008 |
| JP | 2009-181752 A | 8/2009 |
| JP | 2012-018867 A | 1/2012 |
| JP | 2013-054979 A | 3/2013 |
| JP | 2013-251067 A | 12/2013 |
| KR | 10-2004-0000629 A | 1/2004 |
| KR | 10-2006-0130729 A | 12/2006 |
| KR | 10-2008-0058687 A | 6/2008 |
| TW | 2011-31851 A | 9/2011 |
| WO | 2011-093146 A1 | 8/2011 |

* cited by examiner

ORGANIC LIGHT EMTTING DEVICE WITH SHORT CIRCUIT PREVENTING LAYER AND METHOD FOR MANUFACTURING THE SAME

This application is a National Stage Entry of International Application No. PCT/KR2015/004481, filed May 4, 2015 and claims the benefit of and priority to Korean Application No. 10-2014-0056780 filed on May 12, 2014, all of which are hereby incorporated by reference in their entirety for all purposes as if fully set forth herein.

TECHNICAL FIELD

The present specification claims priority to and the benefits of Korean Patent Application No. 10-2014-0056780, filed with the Korean Intellectual Property Office on May 12, 2014, the entire contents of which are incorporated herein by reference.

The present specification relates to an organic light emitting device and a method for manufacturing the same.

BACKGROUND ART

An organic light emission phenomenon refers to a phenomenon converting electrical energy to light energy using an organic material. In other words, when a proper organic material layer is placed between an anode and a cathode and a voltage is applied between the two electrodes, holes and electrons are injected to the organic material layer from the anode and the cathode, respectively. These injected holes and electrons meet to form excitons, and light emits when these excitons fall back to the ground state.

An organic light emitting device is likely to have short defects since space between an anode and a cathode is small. By pin holes, cracks, steps in the structure of an organic light emitting device, coating roughness and the like, an anode and a cathode may be in direct contact with each other, or an organic layer thickness may be made to be thinner in these defect regions. These defect regions provide a low-resistance path that allows a current flow, and make the flow hardly flowing or not flowing at all in extreme cases through an organic light emitting device. As a result, the organic light emitting device has reduced or no light emission output. In multi-pixel display devices, short defects may decline display qualities by producing dead pixels that do not emit light or emit light having intensity less than average light intensity. In illumination or other low-resolution applications, a considerable portion of the corresponding region may not operate due to short defects. With concerns for short defects, manufacture of an organic light emitting device is typically carried out in a clean room. However, no matter how clean the environment is, it cannot be effective in removing short defects. In many cases, the thickness of an organic layer increases more than actually needed to operate a device in order to decrease the number of short defects by increasing a distance between two electrodes. Such a method adds costs in manufacturing an organic light emitting device, and short defects may not even be completely removed using such a method.

PRIOR ART DOCUMENTS

Patent Documents

Korean Patent Application Laid-Open Publication No. 10-2006-0130729 (published on Dec. 19, 2006)

DISCLOSURE

Technical Problem

An object of the present invention is to provide an organic light emitting device capable of operating in a normal range even when factors that may generate short defects are present, that is, when short defects occur, and a method for manufacturing the same.

Technical Solution

One embodiment of the present specification provides an organic light emitting device including a substrate; a short circuit preventing layer provided on the substrate; a first electrode provided on the short circuit preventing layer, and including two or more conductive units provided to be separated from each other; a second electrode provided opposite to the first electrode; one or more organic material layers provided between the first electrode and the second electrode; and an auxiliary electrode provided either on the short circuit preventing layer, or between the short circuit preventing layer and the substrate, wherein the auxiliary electrode is disposed to be separated from the first electrode.

One embodiment of the present specification provides a method for manufacturing the organic light emitting device including preparing a substrate; forming a short circuit preventing layer on the substrate; forming an auxiliary electrode either on the short circuit preventing layer, or between the short circuit preventing layer and the substrate; forming a first electrode including two or more conductive units on the short circuit preventing layer; forming one or more organic material layers on the first electrode; and forming a second electrode on the organic material layers.

One embodiment of the present specification provides a display device including the organic light emitting device.

One embodiment of the present specification provides an illumination device including the organic light emitting device.

Advantageous Effects

An organic light emitting device according to one embodiment of the present specification is capable of normally maintaining a function of the organic light emitting device even when a short circuit occurs due to defects of a substrate itself.

An organic light emitting device according to one embodiment of the present specification can stably operate without increasing a leakage current quantity even when an area size of a short circuit occurring location increases.

When a plastic substrate is used in an organic light emitting device according to one embodiment of the present specification, the short circuit preventing layer can perform a role of a barrier film preventing moisture and oxygen permeation.

In an organic light emitting device according to one embodiment of the present specification, the short circuit preventing layer is capable of performing a light extraction role that smoothly extracts light generated from an organic material layer.

EXPLANATION OF SYMBOLS

101: Substrate
201: Short Circuit Preventing Layer
301: First Electrode
302: First Electrode Material Layer
401: Auxiliary Electrode
402: Auxiliary Electrode Material Layer
501: Insulation Layer
601: Organic Material Layer
701: Second Electrode
801: Encapsulation Layer
901: Resist Pattern

MODE FOR DISCLOSURE

Hereinafter, the present specification will be described in more detail.

In the present specification, a description of one member being placed "on" another member includes not only a case of the one member adjoining the another member but a case of still another member being present between the two members.

In the present specification, a description of a certain part "including" certain constituents means capable of further including other constituents, and does not exclude other constituents unless particularly stated on the contrary.

One embodiment of the present specification provides an organic light emitting device including a substrate; a short circuit preventing layer provided on the substrate; a first electrode provided on the short circuit preventing layer, and including two or more conductive units provided to be separated from each other; a second electrode provided opposite to the first electrode; one or more organic material layers provided between the first electrode and the second electrode; and an auxiliary electrode provided either on the short circuit preventing layer, or between the short circuit preventing layer and the substrate, wherein the auxiliary electrode is disposed to be separated from the first electrode.

The disposed to be separated means the auxiliary electrode and the first electrode being spatially separated from each other. In addition, the disposed to be separated means the auxiliary electrode and the first electrode not physically adjoining to each other.

Short defects may occur when a second electrode is directly in contact with a first electrode. Alternatively, short defects may also occur when an organic material layer loses the function due to a thickness decrease, deformation or the like of the organic material layer located between a first electrode and a second electrode, and the first electrode is in contact with the second electrode. When short defects occur, a low path is provided to the current of an organic light emitting device, and the organic light emitting device may not normally operate. Due to a leakage current in which a current directly flows from a first electrode to a second electrode due to short defects, the current of an organic light emitting device may flow avoiding a defectless area. This may decrease light emission output of the organic light emitting device, and in many cases, the organic light emitting device may not operate. In addition, when a current used to dispersively flow to a large area of organic materials flows intensively to a short circuit occurring location, high heat is generated locally causing a risk of device breakage or fire.

However, in the organic light emitting device according to one embodiment of the present specification, all operating currents flowing to a short defect region may be prevented by the short circuit preventing layer even when short defects occur in any one or more of the conductive units. In other words, the short circuit preventing layer may perform a role of controlling the quantity of a leakage current so that it does not increase infinitely. Accordingly, in the organic light emitting device according to one embodiment of the present specification, the remaining conductive units having no short defects may normally operate even when short defects occur in some of the conductive units.

Specifically, the short circuit preventing layer has a high resistance value, and performs a role of preventing a current escaping through a short defect region by applying moderate resistance when short defects occur. For this, the resistance value of the short circuit preventing layer may be determined considering leakage current control due to short defects, and a driving voltage increase generated due to the short circuit preventing layer when no short defects occur.

According to one embodiment of the present specification, the first electrode and the auxiliary electrode may be provided on the same plane of the short circuit preventing layer. Specifically, according to one embodiment of the present specification, a short circuit preventing layer is formed on the substrate, and then the first electrode and the auxiliary electrode may be formed on the short circuit preventing layer. One example thereof is illustrated in FIG. 1.

Figure 1:
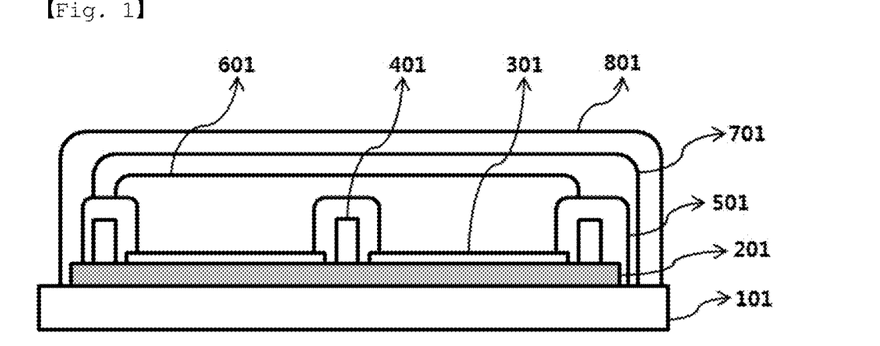
FIG. 1 shows a sectional diagram of an organic light emitting device according to one embodiment of the present specification.

FIG. 1 shows a sectional diagram of the organic light emitting device according to one embodiment of the present specification. Specifically, FIG. 1 shows that a short circuit preventing layer (201) is provided on a substrate (101), a first electrode (301) and an auxiliary electrode (401) are provided on the short circuit preventing layer, and an organic material layer and the auxiliary electrode are insulated with an insulation layer (501). In addition, FIG. 1 shows a sectional diagram in which an organic material layer (601) is provided on the first electrode (301), a second electrode (701) is provided on the organic material layer (601), and the organic light emitting device is sealed with an encapsulation layer (801).

According to one embodiment of the present specification, the auxiliary electrode may be provided on the substrate, and the short circuit preventing layer may be provided on the substrate and the auxiliary electrode. Specifically, according to one embodiment of the present specification, the short circuit preventing layer may be formed on the substrate after the auxiliary electrode is formed on the substrate. In this case, the short circuit preventing layer may cover the remaining surfaces excluding the surface of the auxiliary electrode adjoining the substrate. One example thereof is illustrated in FIG. 2.

Figure 2:
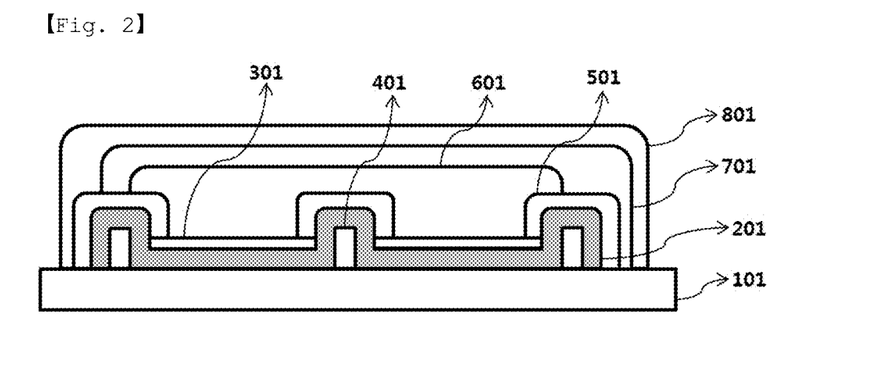
FIG. 2 shows a sectional diagram of an organic light emitting device according to one embodiment of the present specification.

FIG. 2 shows a sectional diagram of the organic light emitting device according to one embodiment of the present specification. Specifically, FIG. 2 shows that an auxiliary electrode (401) is provided on a substrate (101), a short circuit preventing layer (201) is provided on the substrate (101) and the auxiliary electrode (401), a first electrode (301) is provided on the short circuit preventing layer (201), and an organic material layer and the short circuit preventing layer (201) are insulated with an insulation layer (501). In addition, FIG. 2 shows a sectional diagram in which an organic material layer (601) is provided on the first electrode (301), a second electrode (701) is provided on the organic material layer (601), and the organic light emitting device is sealed with an encapsulation layer (801).

According to one embodiment of the present specification, the short circuit preventing layer may be physically continued one unit provided in a region on the substrate provided with the first electrode and the auxiliary electrode. Specifically, according to one embodiment of the present specification, the short circuit preventing layer may be physically continued one unit provided on a region including both a lower surface of the first electrode, and a side surface and an upper surface of the auxiliary electrode, or the short circuit preventing layer may be physically continued one unit provided on a region including both a lower surface of the first electrode and a lower surface of the auxiliary electrode.

The physically continued one unit may mean that the short circuit preventing layer is formed as one continuous layer on a substrate without going through a separate patterning step. The short circuit preventing layer may be formed while covering any one whole surface of the substrate. Alternatively, the short circuit preventing layer may be formed as a physically connected layer on a region excluding some regions of any one surface of the substrate.

When a plastic substrate is used in the organic light emitting device according to one embodiment of the present specification, the short circuit preventing layer may perform a role of a barrier film preventing moisture and oxygen permeation. Specifically, a plastic substrate has an advantage of being suitable as a flexible substrate, but may cause damages in an organic material layer due to moisture and oxygen permeation. The short circuit preventing layer is formed as physically connected one layer on a substrate, therefore, may perform a role of a barrier layer of a plastic substrate.

According to one embodiment of the present specification, the short circuit preventing layer may electrically connect the auxiliary electrode and the first electrode.

Specifically, when a voltage is applied through external power in the organic light emitting device according to one embodiment of the present specification, a current may flow in a direction of an auxiliary electrode→a short circuit preventing layer→a first electrode→an organic material layer→a second electrode or a direction reverse thereto.

According to one embodiment of the present specification, the first electrode may form a pattern, and in this case, the two or more conductive units may be a unit of the pattern. According to one embodiment of the present specification, each of the conductive units may have the shape of a closed figure. Specifically, each of the conductive units may have the shape of a polygon such as a triangle, a quadrangle and a hexagon, or may have an amorphous form.

The any one or more conductive units may be included in one pixel of the organic light emitting device. Specifically, the conductive unit may perform a role of a transparent electrode of each pixel.

Each of the conductive units of the present specification is separated from each other, and a current may be supplied to each of the conductive units from the auxiliary electrode through the short circuit preventing layer. This is for preventing the whole organic light emitting device not operating, when a short circuit occurs in any one conductive unit, by a current having to flow to another unit not experiencing a short circuit flows to the conductive unit experiencing a short circuit.

According to one embodiment of the present specification, each of the conductive units may be electrically parallel connected. In addition, according to one embodiment of the present specification, the conductive units are disposed to be separated from each other, and may be electrically connected through the short circuit preventing layer and the auxiliary electrode.

According to one embodiment of the present specification, the conductive unit may be included in a light emitting region of the organic light emitting device. Specifically, according to one embodiment of the present specification, the light emitting region may include each pixel region of the organic light emitting device, and at least one region of each of the conductive units may be located in the light emitting region of the organic light emitting device. More specifically, according to one embodiment of the present specification, a light emission phenomenon occurs in an organic material layer including a light emitting layer formed on a region forming the conductive unit, and light may emit through the conductive unit.

The light emitting region in the present specification means a region in which light emitting at a light emitting layer of an organic material layer emits through a first electrode and/or a second electrode. For example, in the organic light emitting device according to one embodiment of the present specification, the light emitting region may be formed in at least some of the first electrode region in which the auxiliary electrode is not formed among the regions in which the first electrode is formed on a substrate. In addition, a non-light emitting region in the present specification may mean the remaining regions excluding the light emitting region.

According to one embodiment of the present specification, the short circuit preventing layer may have sheet resistance of greater than or equal to 1 k$\Omega$/□ and less than or equal to 1 M$\Omega$/□.

According to one embodiment of the present specification, the shortest distance between each of the conductive units and the auxiliary electrode may be greater than or equal to 0.5 μm and less than or equal to 20 μm.

The shortest distance between the conductive unit and the auxiliary electrode may be the shortest distance that a current is capable of flowing from the conductive unit to the auxiliary electrode. Specifically, the auxiliary electrode and the conductive unit have a current flowing via the short circuit preventing layer, therefore, it may mean the shortest distance of a current from the conductive unit to the auxiliary electrode via the short circuit preventing layer.

According to one embodiment of the present specification, an insulation layer may be provided between the auxiliary electrode and the conductive unit in order to adjust a distance between the conductive unit and the auxiliary electrode.

According to one embodiment of the present specification, resistance from the auxiliary electrode to any one of the conductive units may be greater than or equal to 400$\Omega$ and less than or equal to 300,000$\Omega$.

According to one embodiment of the present specification, resistance between any one of the conductive units and adjacent another conductive unit may be greater than or equal to 800$\Omega$ and less than or equal to 600,000$\Omega$.

The another conductive unit adjacent to any one of the conductive units may mean another conductive unit physically closest to any one conductive unit.

According to one embodiment of the present specification, the short circuit preventing layer may have a thickness of greater than or equal to 1 nm and less than or equal to 10 μm.

The short circuit preventing layer may maintain a normal operating voltage in the above-mentioned range when no short circuit occurs in an organic light emitting device. In addition, the short circuit preventing layer may perform a short circuit preventing function, and an organic light emitting device may operate in a normal range even when a short circuit occurs.

According to one embodiment of the present specification, the short circuit preventing layer may be transparent. Specifically, according to one embodiment of the present specification, the short circuit preventing layer may have light transmittance of greater than or equal to 60% and less than or equal to 100% in a visible region.

In addition, according to one embodiment of the present specification, the short circuit preventing layer may have light absorptivity of less than 10%.

In the organic light emitting device according to one embodiment of the present specification, the short circuit preventing layer has an advantage of smoothly extracting light generated from an organic material layer.

According to one embodiment of the present specification, the short circuit preventing layer may include one, two or more types selected from the group consisting of conductive polymers; organic polymers; metal oxides; inorganic oxides; and insulating materials. Specifically, according to one embodiment of the present specification, a mixture of two or more selected from the group consisting of zirconium oxide ($ZrO_2$), nichrome, indium tin oxide (ITO), GAZO and silicon dioxide ($SiO_2$) may be used.

According to one embodiment of the present specification, an area of each of the conductive units may be greater than or equal to 0.01 $mm^2$ and less than or equal to 25 $mm^2$. Specifically, according to one embodiment of the present specification, an area of each of the conductive units may be greater than or equal to 0.01 $mm^2$ and less than or equal to 1 $mm^2$.

When an area of each of the conductive units is made to be small, there is an advantage in that both an operating voltage increase rate due to the short circuit preventing layer introduced for preventing a short circuit, and a leakage current value with respect to an operating current are lowered. In addition, there is an advantage in that product quality decline may be minimized by minimizing a non-light emitting region when a conductive unit in which light does not emit due to a short circuit is generated. However, when an area of the conductive unit is made to be too small, a ratio of the light emitting region in the whole organic light emitting device region greatly decreases leading to a problem of an organic light emitting device efficiency decrease caused by an aperture ratio decrease. Accordingly, when the organic light emitting device is manufactured with the area of the conductive unit described above, the advantages described above may be maximally exhibited while minimizing the disadvantages described above.

According to one embodiment of the present specification, the first electrode may include 1,000 or more of the conductive units separated from each other. Specifically, the first electrode may include greater than or equal to 1,000 and less than or equal to 1,000,000 of the conductive units separated from each other.

When the number of the conductive units of the present specification is 1,000 or greater, an effect of the organic light emitting device minimizing a leakage current quantity during the occurrence of a short circuit while minimizing a voltage increase during normal operation may be obtained. In addition, as the number of the conductive units of the present specification increases up to 1,000,000 or less, the effect may be maintained while maintaining an aperture ratio. In other words, when the number of the conductive units is greater than 1,000,000, a decrease in the aperture ratio may occur due to the increase in the number of auxiliary electrodes.

According to one embodiment of the present specification, the conductive unit may have sheet resistance of 1 Ω/□ or greater, or 3 Ω/□ or greater, and specifically, may be 10 Ω/□ or greater. In addition, the conductive unit may have sheet resistance of 500 Ω/□ or less. In other words, the conductive unit of the present specification may have sheet resistance of greater than or equal to 1 Ω/□ and less than or equal to 500 Ω/□, or greater than or equal to 10 Ω/□ and less than or equal to 500 Ω/□.

According to one embodiment of the present specification, the sheet resistance level required for the conductive unit may be controlled so as to be inversely proportional to an area of the conductive unit corresponding to a light emitting area. For example, when the conductive unit has a light emitting area of 100 $cm^2$, the sheet resistance required for the conductive unit may be approximately 1 Ω/□. Moreover, when each of the conductive units is formed to be small, the sheet resistance required for the conductive unit may be 1 Ω/□ or greater.

According to one embodiment of the present specification, when the first electrode is formed as a transparent electrode such as ITO, an auxiliary electrode may be used so that the sheet resistance of the conductive unit satisfies 1 Ω/□ or greater. Specifically, the auxiliary electrode may be a metal auxiliary electrode.

According to one embodiment of the present specification, the sheet resistance of the conductive unit of the present specification may be determined by materials forming the conductive unit, and may also be lowered to a sheet resistance level of an auxiliary electrode by being electrically connected to the auxiliary electrode. Accordingly, the sheet resistance value of the conductive unit required in the organic light emitting device of the present specification may be adjusted by the materials of the auxiliary electrode and the conductive unit.

According to one embodiment of the present specification, the auxiliary electrode may have sheet resistance of 3 Ω/□ or less. Specifically, the auxiliary electrode may have sheet resistance of 1 Ω/□ or less.

When sheet resistance of any one of a first electrode and a second electrode having a large area is higher than is needed, voltages may be different for each location of the electrode. As a result, when a potential difference between the first electrode and the second electrode placing an organic material layer in between becomes different, brightness uniformity of an organic light emitting device may decrease. Accordingly, in order to lower the sheet resistance of the first electrode or the second electrode having higher sheet resistance than is needed, an auxiliary electrode may be used. The sheet resistance of the auxiliary electrode of the present specification may be 3 Ω/□ or less, and specifically 1 Ω/□ or less, and in the above-mentioned range, the organic light emitting device may maintain high brightness uniformity.

According to one embodiment of the present specification, the first electrode may be formed as a transparent electrode. In this case, sheet resistance of the first electrode may be higher than sheet resistance required for the operation of the organic light emitting device. Accordingly, in order to lower the sheet resistance of the first electrode, the sheet resistance of the first electrode may be lowered to the sheet resistance level of the auxiliary electrode by electrically connecting the auxiliary electrode to the first electrode.

According to one embodiment of the present specification, the auxiliary electrode may be formed with conductive lines electrically connected to each other. Specifically, the conductive lines may be formed with conductive patterns. Specifically, the whole auxiliary electrode may be driven by applying a voltage to at least one region of the auxiliary electrode of the present specification.

According to one embodiment of the present specification, the organic light emitting device may be used as being included in OLED illumination. In the case of the OLED illumination, light emission with uniform brightness in the whole light emitting region, that is, in all the organic light emitting devices, is important. Specifically, in order to accomplish uniform brightness in the OLED illumination, voltages formed between the first electrode and the second electrode of all the organic light emitting devices included in the OLED illumination are preferably maintained to be the same.

When the first electrode of the present specification is a transparent electrode, and the second electrode is a metal electrode, the second electrode of each organic light emitting device has sufficiently low sheet resistance, and there is almost no voltage difference in the second electrode of each of the each organic light emitting devices, however, in the case of the first electrode, a voltage difference may exist in each of the each organic light emitting devices. According to one embodiment of the present specification, the auxiliary electrode, and specifically, a metal auxiliary electrode, may be used in order to complement the first electrode voltage difference of each of the organic light emitting devices.

According to one embodiment of the present specification, the metal auxiliary electrode may be formed with conductive lines electrically connected to each other. Specifically, the auxiliary electrode is capable of allowing almost no voltage difference in the first electrode of each organic light emitting device by forming conductive lines.

According to one embodiment of the present specification, the auxiliary electrode may be formed as a stripe structure or mesh structure. When the auxiliary electrode is formed as a mesh structure, the conductive unit may be provided in empty space of the mesh.

According to one embodiment of the present specification, the auxiliary electrode may have a line width of greater or equal to 1 μm and less than or equal to 100 μm.

The line width of the auxiliary electrode may mean a line thickness of the auxiliary electrode based on the parallel section of a substrate surface provided with the auxiliary electrode. In addition, the line width of the auxiliary electrode may mean the thickest line thickness of the auxiliary electrode based on the parallel section of a substrate surface provided with the auxiliary electrode.

When the auxiliary electrode is formed to have the line width in the above-mentioned range, efficiency of the organic light emitting device may increase by securing an aperture ratio.

According to one embodiment of the present specification, the auxiliary electrode may be provided as a mesh structure surrounding one or more of the conductive units.

The mesh structure may form an aperture region having a repeated shape of a triangle, a quadrangle, a hexagon or the like.

According to one embodiment of the present specification, the auxiliary electrode may have an aperture ratio of 60% or greater. Specifically, the auxiliary electrode may have an aperture ratio of 75%, or 80% or greater.

According to one embodiment of the present specification, the organic light emitting device may have an aperture ratio of 60% or greater based on the light emitting surface.

According to one embodiment of the present specification, the area the conductive units occupy in the organic light emitting device may be greater than or equal to 50% and less than or equal to 90% based on the plane diagram of the whole organic light emitting device. Specifically, the conductive unit is included in a light emitting region, and the area the conductive units occupy may be the same as or similar to the aperture ratio of the organic light emitting device based on the light emitting surface of the whole organic light emitting device.

According to one embodiment of the present specification, the first electrode may be a transparent electrode.

When the first electrode is a transparent electrode, the first electrode may be a conductive oxide such as indium tin oxide (ITO) or indium zinc oxide (IZO). Moreover, the first electrode may be a semi-transparent electrode. When the first electrode is a semi-transparent electrode, the first electrode may be prepared with a semi-transparent metal such as Ag, Au, Mg, Ca or alloys thereof. When a semi-transparent metal is used as the first electrode, the organic light emitting device may have a microcavity structure.

According to one embodiment of the present specification, the auxiliary electrode may be formed with metal materials. In other words, the auxiliary electrode may be a metal electrode.

The auxiliary electrode may generally use all metals. Specifically, aluminum, copper and/or silver having favorable conductivity may be included. When the auxiliary electrode uses aluminum for adhesion with a transparent electrode or stability in a photo process, a molybdenum/aluminum/molybdenum layer may also be used.

According to one embodiment of the present specification, the organic material layer includes at least one or more light emitting layers, and may further include one, two or more types selected from the group consisting of a hole injection layer; a hole transfer layer; a hole blocking layer; a charge generating layer; an electron blocking layer; an electron transfer layer; and an electron injection layer.

The charge generating layer means a layer generating holes and electrons when a voltage is applied.

As the substrate, a substrate having excellent transparency, surface smoothness, handling easiness and water resistance may be used. Specifically, a glass substrate, a thin glass substrate or a transparent plastic substrate may be used. The plastic substrate may include a film such as polyethylene terephthalate (PET), polyethylene naphthalate (PEN), polyether ether ketone (PEEK) and polyimide (PI) in the form of a single layer or multilayer. In addition, the substrate may include a light scattering function in the substrate itself. However, the substrate is not limited thereto, and substrates commonly used in organic light emitting devices may be used.

According to one embodiment of the present specification, the first electrode may be an anode, and the second electrode may be a cathode. In addition, the first electrode may be a cathode, and the second electrode may be an anode.

As the anode, a material having large work function is normally preferable so that hole injection to the organic material layer is smooth. Specific examples of the anode material capable of being used in the present invention include metals such as vanadium, chromium, copper, zinc and gold, or alloys thereof; metal oxides such as zinc oxides, indium oxides, indium tin oxides (ITO) and indium zinc oxide (IZO); combinations of metals and oxides such as ZnO:Al or $SnO_2$:Sb; conductive polymers such as poly(3-methylthiophene), poly[3,4-(ethylen-1,2-dioxy)thiophene] (PEDOT), polypyrrole and polyaniline, and the like, but are not limited thereto.

The materials of the anode are not limited to the anode, and may be used as a material of the cathode.

As the cathode, a material having small work function is normally preferable so that electron injection to the organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The materials of the cathode are not limited to the cathode, and may be used as a material of the anode.

As the hole transfer layer material according to the present specification, a material capable of receiving the holes from the anode or the hole injection layer, moving the holes to the light emitting layer, and having high mobility for the holes, is suitable. Specific examples thereof include an arylamin-based organic material, a conductive polymer, a block copolymer having conjugated parts and non-conjugated parts together, and the like, but are not limited thereto.

As the light emitting layer material according to the present specification, a material capable of emitting light in a visible region by receiving holes and electrons from the hole transfer layer and the electron transfer layer, respectively, and binding the holes and the electrons, and is preferably a material having favorable quantum efficiency for fluorescence or phosphorescence. Specific examples thereof include a 8-hydroxy-quinoline aluminum complex (Alq3); a carbazole-based compound; a dimerized styryl compound; BAlq; a 10-hydroxybenzo quinolin-metal compound; a benzoxazole-, a benzthiazole- and a benzimidazole-based compound; a poly(p-phenylenevinylene) (PPV)-based polymer; a spiro compound; polyfluorene, rubrene, and the like, but are not limited thereto.

As the electron transfer layer material according to the present specification, a material capable of favorably receiving electrons from the cathode, moving the electrons to the light emitting layer, and having high mobility for the electrons, is suitable. Specific examples thereof include an Al complex of 8-hydroxyquinoline; a complex including Alq3; an organic radical compound; a hydroxyflavon-metal complex and the like, but are not limited thereto.

According to one embodiment of the present specification, the auxiliary electrode may be located in a non-light emitting region of the organic light emitting device.

According to one embodiment of the present specification, the organic light emitting device may further include an insulation layer in a non-light emitting region. Alternatively, when the insulation layer is formed with transparent materials, a region corresponding to the auxiliary electrode may be located in a non-light emitting region, and a region corresponding to the conductive unit may be located in a light emitting region.

According to one embodiment of the present specification, the insulation layer may perform a role of insulating the first electrode and the auxiliary electrode. In addition, the insulation layer may perform a role of insulating the first electrode, the auxiliary electrode and the short circuit preventing layer from the organic material layer.

According to one embodiment of the present specification, the organic light emitting device may be sealed with an encapsulation layer.

The encapsulation layer may be formed with a transparent resin layer. The encapsulation layer performs a role of preventing the organic light emitting device from oxygen and contaminants, and may be a transparent material so as not to inhibit light emission of the organic light emitting device. The transparency may mean transmitting 60% or more of light, and specifically, transmitting 75% or more of light.

According to one embodiment of the present specification, the organic light emitting device may emit white light having a color temperature of greater than or equal to 2,000 K and less than or equal to 12,000 K.

According to one embodiment of the present specification, a light scattering layer may be further included between the substrate and the first electrode.

Specifically, according to one embodiment of the present specification, a substrate provided on a surface opposite to the surface provided with the organic material layer of the first electrode may be further included, and a light scattering layer provided between the substrate and the first electrode may be further included. According to one embodiment of the present specification, the light scattering layer may include a planarization layer. According to one embodiment of the present specification, the planarization layer may be provided between the first electrode and the light scattering layer.

Alternatively, according to one embodiment of the present specification, a light scattering layer may be further included on a surface opposite to the surface provided with the first electrode of the substrate.

According to one embodiment of the present specification, the light scattering layer induces light scattering, and the structure is not particularly limited as long as it has a structure capable of enhancing light scattering efficiency of the organic light emitting device. Specifically, according to one embodiment of the present specification, the light scattering layer may have a structure in which scattered particles are dispersed into a binder, a film having unevenness, and/or a film having hazeness.

According to one embodiment of the present specification, the light scattering layer may be directly formed on the substrate using a method such as spin coating, bar coating and slit coating, or may be formed using a method of being prepared in a film form and attached.

According to one embodiment of the present specification, the organic light emitting device may be a flexible organic light emitting device. In this case, the substrate may include a flexible material. Specifically, the substrate may be bendable thin-film-type glass, a plastic substrate or film-type substrate.

A material of the plastic substrate is not particularly limited, however, a film such as polyethylene terephthalate (PET), polyethylene naphthalate (PEN), polyether ether ketone (PEEK) and polyimide (PI) may be generally included in the form of a single layer or multilayer.

The present specification provides a display device including the organic light emitting device. The organic light emitting device may perform a role of a pixel or back light in the display device. As other constitutions of the display device, constitutions known in the art may be used.

The present specification provides an illumination device including the organic light emitting device. The organic light emitting device may perform a role of a light emitting unit in the illumination device. As other constitutions of the illumination device, constitutions known in the art may be used.

One embodiment of the present specification provides a method for manufacturing the organic light emitting device including preparing a substrate; forming a short circuit preventing layer on the substrate; forming an auxiliary electrode either on the short circuit preventing layer, or between the short circuit preventing layer and the substrate; forming a first electrode including two or more conductive units on the short circuit preventing layer; forming one or more organic material layers on the first electrode; and forming a second electrode on the organic material layers.

According to one embodiment of the present specification, the forming of an auxiliary electrode may use photo etching; deposition; or printing. Specifically, the forming of an auxiliary electrode may use a method for forming the auxiliary electrode as a stripe structure or mesh structure. As the photo etching, deposition and printing, methods generally used in the art may be used without limits.

According to one embodiment of the present specification, the forming of an auxiliary electrode may use photo etching or over etching after the forming of a short circuit preventing layer, and the forming of a first electrode may be depositing a first electrode material using a resist used in the photo etching as a mask. When such a process is used, there is an advantage in that a separate mask for forming the first electrode to two or more conductive units is not required. One example thereof is illustrated in FIG. 3.

Figure 3:
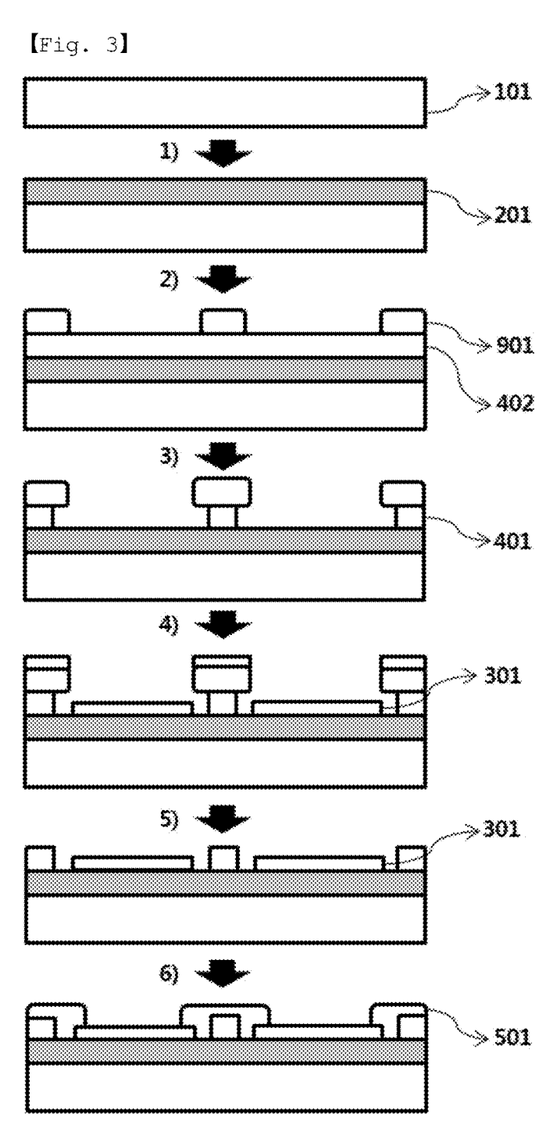
FIG. 3 shows some steps in a method for manufacturing an organic light emitting device according to one embodiment of the present specification.

FIG. 3 shows some steps in a method for manufacturing an organic light emitting device according to one embodiment of the present specification.

FIG. 3 shows that 1) a short circuit preventing layer (201) is formed on a substrate (101), 2) after an auxiliary electrode material layer (402) is formed on the short circuit preventing layer (201), a resist pattern (901) is formed on the auxiliary electrode material layer (402), 3) the auxiliary electrode material layer is over etched, 4) a first electrode (301) is formed by depositing a first electrode material using the resist pattern (901) as a mask, 5) the resist pattern is removed, and 6) the first electrode (301) and the auxiliary electrode (401) are insulated using an insulation layer (501).

According to one embodiment of the present specification, the forming of an auxiliary electrode may be forming an auxiliary electrode having a reverse taper angle through photo etching after the forming of a short circuit preventing layer, and the forming of a first electrode may be depositing a first electrode material on the short circuit preventing layer provided with the auxiliary electrode. When such a process is used, there is an advantage in that a separate mask for forming the first electrode to two or more conductive units is not required. One example thereof is illustrated in FIG. 4.

The reverse taper angle is based on the substrate surface on which the auxiliary electrode is formed, and when the auxiliary electrode has a reverse taper angle, the auxiliary electrode may be provided on the substrate in a reverse trapezoidal form.

Figure 4:
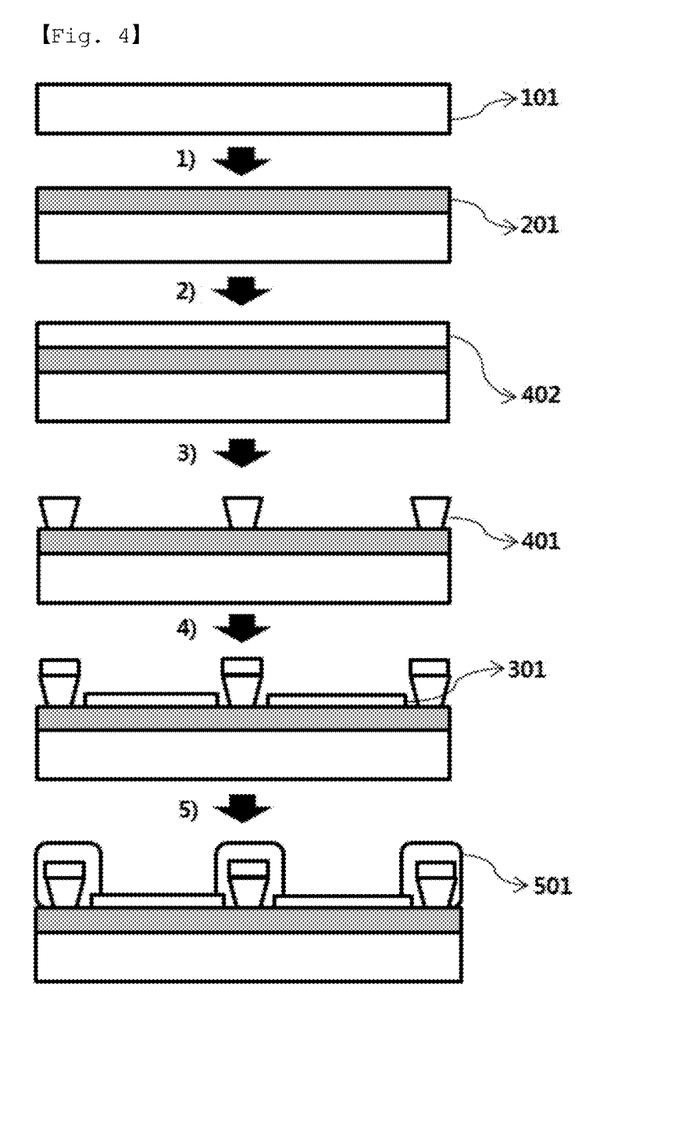
FIG. 4 shows some steps in a method for manufacturing an organic light emitting device according to one embodiment of the present specification.

FIG. 4 shows some steps in a method for manufacturing an organic light emitting device according to one embodiment of the present specification.

FIG. 4 show that 1) a short circuit preventing layer (201) is formed on a substrate (101), 2) an auxiliary electrode material layer (402) is formed on the short circuit preventing layer (201), 3) the auxiliary electrode material layer (402) is formed into an auxiliary electrode (401) having a reverse taper angle, 4) a first electrode (301) is formed by depositing a first electrode material on the short circuit preventing layer (201) on which the auxiliary electrode (401) is formed, and 5) the first electrode (301) and the auxiliary electrode (401) are insulated using an insulation layer (501).

According to one embodiment of the present specification, the first electrode material formed on the auxiliary electrode may or may not be removed. The function of the auxiliary electrode does not decline even when the first electrode material formed on the auxiliary electrode is not removed, therefore, a process of removing the first electrode material formed on the auxiliary electrode may not be added.

Figure 5:
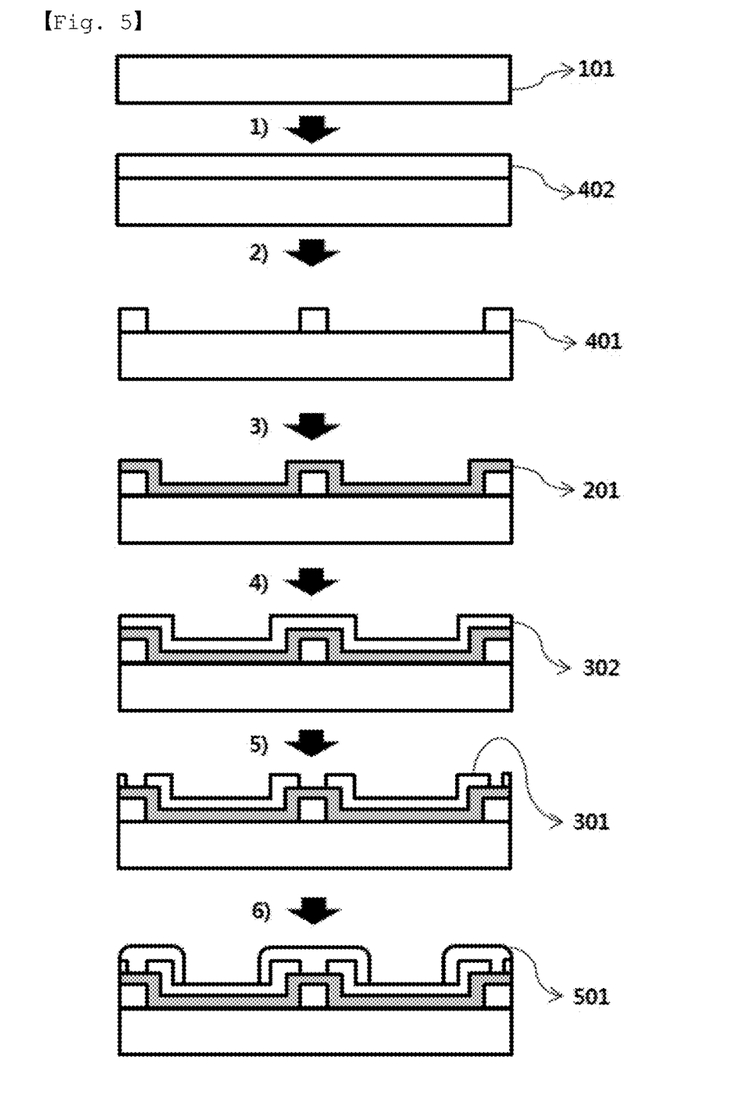
FIG. 5 shows some steps in a method for manufacturing an organic light emitting device according to one embodiment of the present specification.

According to one embodiment of the present specification, the forming of an auxiliary electrode may be carried out either after the forming of a short circuit preventing layer, or prior to the forming of a short circuit preventing layer. FIG. 5 shows a case carrying out the forming of an auxiliary electrode prior to the forming of a short circuit preventing layer.

FIG. 5 shows some steps in a method for manufacturing an organic light emitting device according to one embodiment of the present specification.

FIG. 5 show that 1) an auxiliary electrode material layer (402) is formed on a substrate (101), 2) an auxiliary electrode (401) is formed by patterning the auxiliary electrode material layer (402), 3) a short circuit preventing layer (201) is formed on the substrate (101) on which the auxiliary electrode (401) is formed, 4) a first electrode material layer (302) is formed on the short circuit preventing layer (201), 5) a first electrode (201) is formed by forming the first electrode material layer (302) to two or more conductive units, and 6) an insulation layer (501) is formed in order to insulate the first electrode and the short circuit preventing layer from an organic material layer.

According to one embodiment of the present specification, an insulation layer may be additionally formed between 3) and 4) of FIG. 5. Specifically, the insulation layer may be formed on the short circuit preventing layer region surrounding the auxiliary electrode, and this may become means for adjusting a distance between the auxiliary electrode and the conductive unit.

The invention claimed is:

1. An organic light emitting device comprising:
a substrate;
a short circuit preventing layer provided on the substrate;
a first electrode provided on the short circuit preventing layer, and including two or more conductive units provided to be separated from each other;
a second electrode provided opposite to the first electrode;
one or more organic material layers provided between the first electrode and the second electrode; and
an auxiliary electrode provided on the substrate, and separated from the first electrode,
wherein the short circuit preventing layer, which has a thickness in a range of 1 nm to 10 μm and a sheet resistance in a range of 1 kΩ/□ to 1 MΩ/□, electrically connects the auxiliary electrode and the first electrode, and
wherein the short circuit preventing layer is not electrically connected to the second electrode.

2. The organic light emitting device of claim 1, wherein the first electrode and the auxiliary electrode are provided on the same plane of the short circuit preventing layer.

3. The organic light emitting device of claim 1, wherein the auxiliary electrode is provided on the substrate, and the short circuit preventing layer is provided on the substrate and the auxiliary electrode.

4. The organic light emitting device of claim 1, wherein the short circuit preventing layer is physically continued one unit provided in a region on the substrate provided with the first electrode and the auxiliary electrode.

5. The organic light emitting device of claim 1, wherein a shortest distance between each of the conductive units and the auxiliary electrode is greater than or equal to 0.5 μm and less than or equal to 20 μm.

6. The organic light emitting device of claim 1, wherein resistance from the auxiliary electrode to any one of the conductive units is greater than or equal to 400 Ω and less than or equal to 300,000 Ω.

7. The organic light emitting device of claim 1, wherein resistance between any one of the conductive units and adjacent another conductive unit is greater than or equal to 800 Ω and less than or equal to 600,000 Ω.

8. The organic light emitting device of claim 1, wherein an area of each of the conductive units is greater than or equal to 0.01 mm² and less than or equal to 25 mm².

9. The organic light emitting device of claim 1, wherein the short circuit preventing layer has light absorptivity of less than 10%.

10. The organic light emitting device of claim 1, wherein the conductive unit has sheet resistance of greater than or equal to 1 Ω/and less than or equal to 500 Ω/□.

11. The organic light emitting device of claim 1, wherein the auxiliary electrode has sheet resistance of 3 Ω/□ or less.

12. The organic light emitting device of claim 1, wherein the auxiliary electrode has a line width of greater or equal to 1 μm and less than or equal to 100 μm.

13. The organic light emitting device of claim 1, wherein the auxiliary electrode is provided as a mesh structure surrounding one or more of the conductive units.

14. The organic light emitting device of claim 1, wherein the auxiliary electrode has an aperture ratio of 60% or greater.

15. The organic light emitting device of claim 1, wherein the substrate is bendable thin-film-type glass, a plastic substrate or film-type substrate.

16. A display device comprising the organic light emitting device of claim 1.

17. An illumination device comprising the organic light emitting device of claim 1.

18. A method for manufacturing the organic light emitting device of claim 1 comprising:
preparing a substrate;
forming a short circuit preventing layer on the substrate;
forming an auxiliary electrode on the substrate;
forming a first electrode including two or more conductive units on the short circuit preventing layer;
forming one or more organic material layers on the first electrode; and
forming a second electrode on the organic material layers,
wherein the auxiliary electrode is disposed to be separated from the first electrode, and
wherein the short circuit preventing layer electrically connects the auxiliary electrode and the first electrode.

19. The method for manufacturing the organic light emitting device of claim 18, wherein the forming of an auxiliary electrode uses photo etching; deposition; or printing.

20. The method for manufacturing the organic light emitting device of claim 18, wherein the forming of an auxiliary electrode uses photo etching and over etching after the forming of a short circuit preventing layer, and the forming of a first electrode is depositing a first electrode material using a resist used in the photo etching as a mask.

21. The method for manufacturing the organic light emitting device of claim 18, wherein the forming of an auxiliary electrode is forming an auxiliary electrode having a reverse taper angle through photo etching after the forming of a short circuit preventing layer, and the forming of a first electrode is depositing a first electrode material on the short circuit preventing layer provided with the auxiliary electrode.

22. The organic light emitting device of claim 1, wherein the auxiliary electrode is formed on the substrate in a reverse trapezoidal form based on the substrate surface on which the auxiliary electrode is formed.

23. The organic light emitting device of claim 1, wherein the short circuit preventing layer comprises a mixture of two or more compound materials selected from the group consisting of zirconium oxide, nichrome, indium tin oxide, gallium zinc oxide and silicon dioxide.

24. The method for manufacturing the organic light emitting device of claim 18, wherein the short circuit preventing layer comprises a mixture of two or more compound materials selected from the group consisting of zirconium oxide, nichrome, indium tin oxide, gallium zinc oxide and silicon dioxide.

* * * * *